United States Patent
Bayat et al.

(10) Patent No.: US 11,399,442 B2
(45) Date of Patent: Jul. 26, 2022

(54) COLORED COATINGS FOR ELECTRONIC DEVICES

(71) Applicant: Apple Inc., Cupertino, CA (US)

(72) Inventors: Khadijeh Bayat, Santa Clara, CA (US); Yoshitaka Matsui, Yokohama (JP); Naomi Sugawara, Yokohama (JP); Daisuke Nozu, Saitama (JP); Xianwei Zhao, Fremont, CA (US); Avery P. Yuen, Campbell, CA (US); Martin Melcher, Mountain View, CA (US); James R. Wilson, Cupertino, CA (US); Di Fan, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 431 days.

(21) Appl. No.: 16/403,425

(22) Filed: May 3, 2019

(65) Prior Publication Data
US 2020/0015390 A1    Jan. 9, 2020

Related U.S. Application Data

(60) Provisional application No. 62/693,872, filed on Jul. 3, 2018.

(51) Int. Cl.
*H05K 5/06* (2006.01)
*B32B 1/02* (2006.01)
(Continued)

(52) U.S. Cl.
CPC .............. *H05K 5/069* (2013.01); *B32B 1/02* (2013.01); *C03C 17/3655* (2013.01);
(Continued)

(58) Field of Classification Search
CPC ...... H05K 5/02; H05K 5/0217; H05K 5/0243; H05K 5/0247; H05K 5/04; H05K 5/065; H05K 5/069; H05K 9/0007; H05K 9/0009; B32B 1/02; H04M 1/18; H04M 1/185; C03C 17/34; C03C 17/3402; C03C 17/3411; C03C 17/3417; C03C 17/3423;
(Continued)

(56) References Cited

U.S. PATENT DOCUMENTS

| | | |
|---|---|---|
| 7,684,178 B2 | 3/2010 | Hsu et al. |
| 7,781,768 B2 | 8/2010 | Sakakura et al. |
| 8,076,011 B2 | 12/2011 | Chiang et al. |
| 8,648,346 B2 | 2/2014 | Isa et al. |

(Continued)

*Primary Examiner* — Walter Aughenbaugh
(74) *Attorney, Agent, or Firm* — Treyz Law Group, P.C.; G. Victor Treyz; David K. Cole

(57) ABSTRACT

An electronic device may have transparent housing structures such as walls formed of glass or sapphire. Housing structures such as transparent housing structures may have a colored coating. The colored coating may include an absorptive layer and a metal layer. The coating may exhibit a color that can be adjusted by adjusting the thickness of the thin absorptive layer. A colored layer such as a layer of colored polymer may be incorporated into the colored coating to further adjust the color of the coating. The colored coating may be formed on an inner or outer housing structure surface. The surface may have a texture to provide the coating with a matte appearance. When formed on an outer surface, a diamond-like carbon layer may protect the colored coating. When formed on an inner surface, a passivation layer may be used to prevent oxidation of the metal layer.

20 Claims, 8 Drawing Sheets

(51) Int. Cl.
    *C03C 17/36* (2006.01)
    *H05K 5/02* (2006.01)
    *H05K 9/00* (2006.01)
(52) U.S. Cl.
    CPC ....... *C03C 17/3684* (2013.01); *H05K 5/0243* (2013.01); *H05K 9/0009* (2013.01); *C03C 2217/72* (2013.01)
(58) Field of Classification Search
    CPC . C03C 17/3429; C03C 17/3435; C03C 17/36; C03C 17/3607; C03C 17/3613; C03C 17/3626; C03C 17/3636; C03C 17/3642; C03C 17/3649; C03C 17/3652; C03C 17/3655; C03C 17/3676; C03C 17/3684
    See application file for complete search history.

(56) References Cited

U.S. PATENT DOCUMENTS

| | | |
|---|---|---|
| 8,779,993 B2 | 7/2014 | Chiang |
| 9,146,590 B2 | 9/2015 | Myers |
| 9,185,813 B2 | 11/2015 | Diebel |
| 9,243,317 B2 | 1/2016 | Liu et al. |
| 9,357,665 B2 * | 5/2016 | Myers .................. H04M 1/0249 |
| 9,575,392 B2 | 2/2017 | Hooton et al. |
| 9,678,258 B2 | 6/2017 | Hankey et al. |
| 10,240,238 B2 | 3/2019 | Croopnick |
| 2014/0254072 A1 * | 9/2014 | Zhang .................... G06F 1/181 |
| | | 361/679.01 |
| 2015/0271911 A1 * | 9/2015 | Chen .................... H05K 9/0081 |
| | | 361/760 |
| 2016/0353616 A1 | 12/2016 | Dinh et al. |

* cited by examiner

COLORED COATINGS FOR ELECTRONIC DEVICES

This application claims the benefit of provisional patent application No. 62/693,872, filed Jul. 3, 2018, which is hereby incorporated by reference herein in its entirety.

FIELD

This relates generally to electronic devices, and, more particularly, to colored coatings for electronic devices.

BACKGROUND

Electronic devices such as cellular telephones, computers, watches, and other devices may contain housing structures formed of glass and other materials. For example, an electronic device may have a rear housing wall that is covered with a layer of glass.

If care is not taken, housing structures may have an undesired appearance. For example, a coating layer on a housing may have an unattractive color or may have an appearance that changes more than desired as a function of viewing angle.

SUMMARY

An electronic device may include electrical components and other components mounted within a housing. The housing may have transparent housing structures such as walls formed of glass or sapphire.

Housing structures such as transparent housing structures may have a colored coating. The colored coating may cover a housing wall or may be patterned to form a logo or trim.

The colored coating may include a thin absorptive layer and a metal layer configured so that the coating exhibits a desired color. Adjustments to the colored coating such as adjustments to the thickness of the thin absorptive layer may be used to alter the color of the coating. If desired, a colored layer such as a layer of colored polymer may be incorporated into the colored coating to further adjust the color of the coating.

The colored coating may be formed on an inner or outer housing structure surface. The surface may have a texture to provide the coating with a matte appearance. When formed on an outer surface, a transparent diamond-like carbon layer may be included in the colored coating to protect the colored coating from scratches. When formed on an inner surface, a passivation layer may be included on the inner side of the colored coating to prevent oxidation of the metal layer.

DETAILED DESCRIPTION

Electronic devices and other items may be provided with structures that have coatings. The structures may be formed from glass, polymer, crystalline material such as sapphire, metal, and/or other materials. In some arrangements, the structures may form a rear housing wall, sidewall, or other housing structures. The housing structures may, if desired, be transparent housing structures such as layers of glass or sapphire. Coatings can be formed on the inner or outer surfaces of housing structures. For example, an inner surface of a transparent rear housing wall may be provided with a logo-shaped coating or a blanket coating that covers the entire wall. In some configurations, edge portions of a protective display cover layer that overlaps a layer of pixels in a display may be provided with a coating.

A coating may be colored to impart a desired color to a portion of a device. The color that is provided by the coating may be a non-neutral color such as red, yellow, blue, green, rose gold, champagne, or other non-neutral color. The coating may, if desired, exhibit desirable properties such as color invariance over a wide range of viewing angles (e.g., exhibiting less than 5% or less than 10% change in color coordinate values over viewing angles ranging +/−40° from the surface normal of a coated surface), the ability to form the coating from a relatively small number of layers of material (e.g., 2 or 3 layers, 2-4 layers, etc.), the ability to cover a wide range of different color options, high reliability, good manufacturability, and/or low cost.

Figure 1:
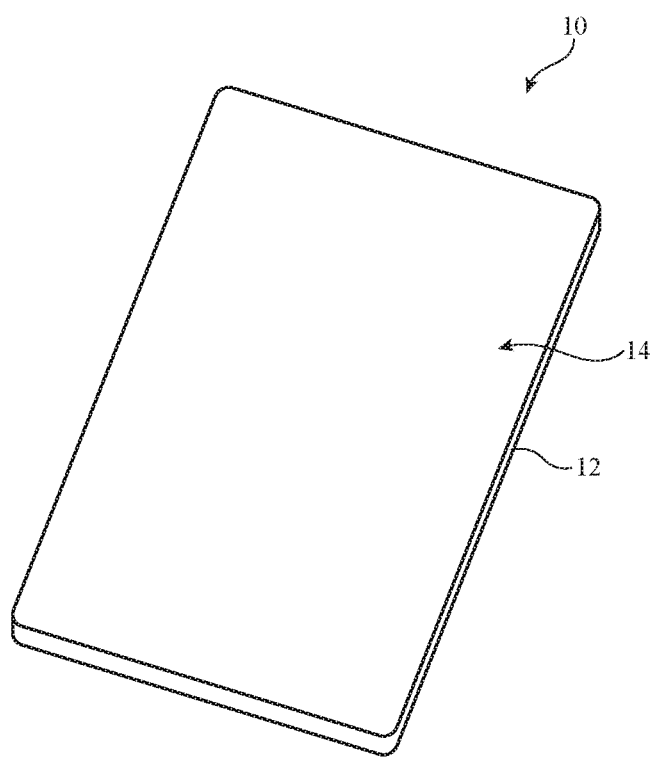
FIG. 1 is a perspective view of an illustrative electronic device of the type that may include a coating in accordance with an embodiment.

An illustrative electronic device of the type that may include a structure that is coated with a colored coating layer is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wristwatch device (e.g., a watch with a wrist strap), a pendant device, a headphone or earpiece device, a device embedded in eyeglasses, goggles, a helmet or other equipment worn on a user's head (e.g., a head-mounted display), or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment. In the illustrative configuration of FIG. 1, device 10 is a portable device such as a cellular telephone, media player, tablet computer, wrist device, or other portable computing device. Other configurations may be used for device 10 if desired. The example of FIG. 1 is merely illustrative.

In the example of FIG. 1, device 10 includes a display such as display 14 mounted in a housing. The housing may include housing structures such as housing sidewalls 12 and other structures for supporting display 14.

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures.

Display 14 may include an array of pixels formed from liquid crystal display (LCD) components, an array of electrophoretic pixels, an array of plasma pixels, an array of organic light-emitting diode pixels or other light-emitting diodes, an array of electrowetting pixels, or pixels based on other display technologies. If desired, display 14 may use a microelectromechanical systems pixel array.

Display 14 may include one or more layers of transparent material. For example, the outermost layer of display 14, which may sometimes be referred to as a display cover layer, may be formed from rigid polymer or a hard transparent material such as glass or sapphire to help protect more sensitive portions of display 14 from damage. Other portions of device 10 such as housing structures on the sidewall or rear wall of device 10 may also be formed from transparent material (e.g., glass, sapphire, polymer, etc.).

Figure 2:
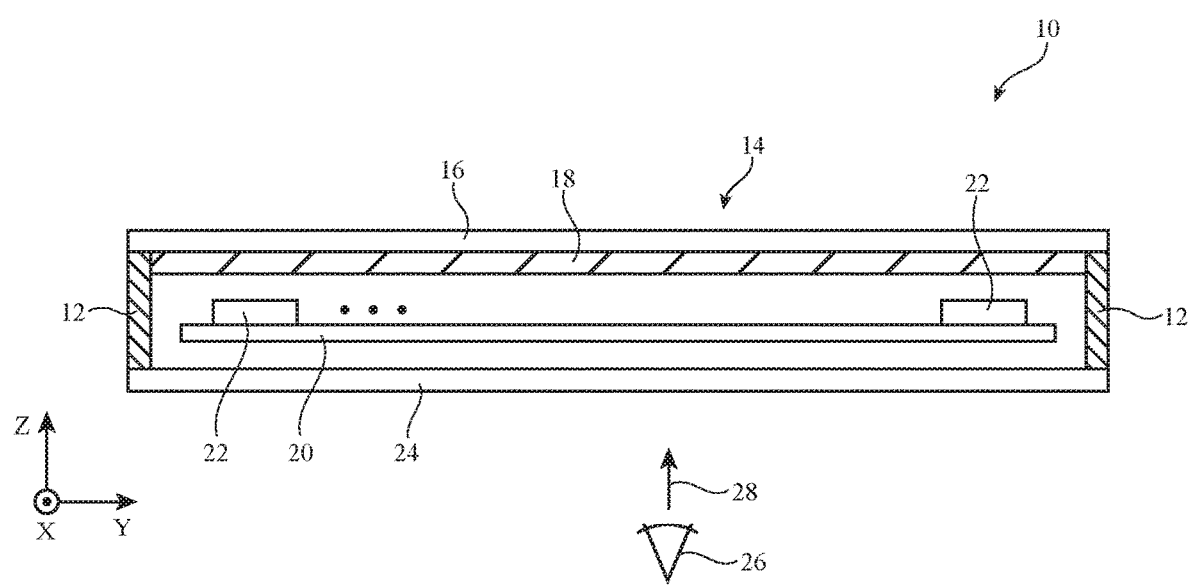
FIG. 2 is a cross-sectional side view of an illustrative electronic device in accordance with an embodiment.

FIG. 2 is a cross-sectional side view of an illustrative device such as device 10 of FIG. 1. As shown in FIG. 2, the housing for device 10 may include housing structures such as housing sidewalls 12 on the sides of device 10 and rear housing wall 24 on a rear face of device 10 (as an example). Sidewalls 12 and/or rear housing wall 24 may be formed from metal, glass, sapphire or other crystalline material, polymer, fiber composite materials, and/or other materials. As an example, some or all of sidewalls 12 may be formed from metal and some or all of rear housing wall 24 may be formed from transparent material such as glass or sapphire. Other configurations may be used, if desired.

As shown in FIG. 2, display 14 may include display cover layer 16 (e.g., a layer of glass, sapphire, or clear polymer) and display layer 18 (e.g., a display layer that includes an array of pixels to present images for a user on the front face of device 10). Display layer 18, which may sometimes be referred to as a pixel array layer, may be a liquid crystal display structure, an organic light-emitting diode display structure (e.g., a flexible organic light-emitting diode display layer), or other suitable display. During operation, display layer 18 may present images that are viewable through transparent portions of display cover layer 16. In some arrangements, edge portions of display cover layer 16 may bend downwards to form portions of sidewall 12 and/or edge portions of rear wall 24 may bend upwards to form portions of sidewall 12.

Internal components in device 10 such as components 22 (e.g., electrical components such as integrated circuits, sensors, etc.) may be mounted on one or more substrates such as printed circuit 20 in the interior of device 10.

To hide internal components such as components 22 from view, inactive border areas in layer 16 and portions of other transparent structures (e.g., a transparent rear housing layer such as rear housing wall 24 on the rear face of device 10 and/or transparent housing sidewall structures) may be covered with coatings (e.g., opaque coatings). Coating layers may be formed on the inner and/or outer surfaces of these housing structures. For example, a coating may be formed on some or all of the inner surface of sidewall 12, the inner surface of rear housing wall 24, and/or the inner surface of border portions of display cover layer 16. Arrangements in which the coating is formed on some or all of the outer surfaces of these structures may also be used.

In some arrangements, a coating may be used primarily to block light (e.g., to hide internal device structures from view). In other arrangements, a patterned coating may be used to form text, logos, trim, and/or other decorative patterns. Black coatings may sometimes be used to form opaque masking layers. Coatings for structures in device 10 may also have non-neutral colors (e.g., blue, red, yellow, gold, rose gold, red-violet, pink, etc.).

A colored coating for device 10 may from metal (e.g., aluminum, gold, and/or other highly reflective metals), absorptive materials (e.g., amorphous semiconductor layers such as layers of amorphous silicon or amorphous germanium), colored polymers and/or other dielectrics, and/or other materials. Materials for the coatings may include organic materials such as polymer layers and/or inorganic materials such as oxide layers, nitride layers, and/or other inorganic dielectric materials. Polymer may include dye, pigment, or other colorants to impart a desired color to the polymer. In some arrangements, a coating may include a transparent (optical) diamond-like carbon layer (e.g., a hard amorphous carbon layer). A transparent diamond-like carbon layer may, for example, be used as a protective outer layer in a coating. The visible light transmission of the diamond-like carbon layer in this type of arrangement may be at least 90%, at least 95%, at least 99%, at least 99.8%, or less than 99.99% (as examples). The relative amounts of sp3 bonds, sp2 bonds, and hydrogen content in the diamond-like carbon layer may be adjusted during deposition to ensure that the diamond-like carbon layer has a desired hardness for resisting scratches while maintaining a desired optical transparency so that underlying color coating layers are visible to the user.

Figure 3:
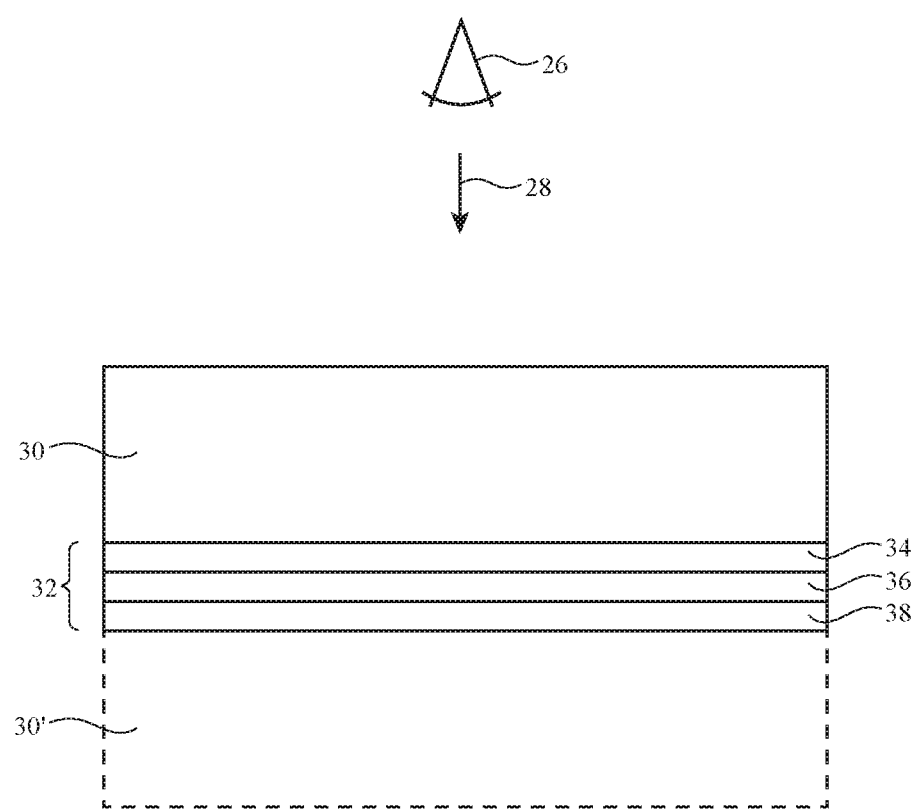
FIG. 3 is a cross-sectional side view of an illustrative housing structure with a coating in accordance with an embodiment.

FIG. 3 is a cross-sectional side view of an illustrative coating layer. In the example of FIG. 3, coating 32 has been formed on an inner surface of layer 30. Layer 30, which may sometimes be referred to as a substrate layer, may be a transparent layer of glass, sapphire, or polymer (as examples). In device 10, layer 30 may serve as a housing structure (e.g., some or all of sidewall 12 and/or rear housing wall 24) and/or may be a peripheral border portion of display cover layer 16 (a housing structure of glass, polymer, sapphire, or other suitable material that is formed near the edge of the array of pixels displaying images for a user of device 10).

Coating layer 32 may include layers 34 and 36. Layer 36 may be a reflective layer formed from a material such as metal. For example, layer 36 may be an aluminum layer. The thickness of layer 36 may be at least 30 nm, 30-50 nm, at least 50 nm, at least 20 nm, less than 70 nm, or other suitable thickness.

Layer 34 may be an absorptive layer (e.g., a layer that absorbs at least some of the light passing through layer 34). Absorptive layer 34 may be interposed between viewer 26 and layer 36. For example, in arrangements in which coating 32 is formed on the inner surface of a layer such as layer 30, layer 34 may be interposed between layer 30 and layer 36. Layer 34 may, if desired, be formed directly on the inner surface of layer 30. Absorptive layer 34 may be formed form an absorptive material such as amorphous silicon that absorbs visible light. The index of refraction of amorphous silicon is relatively high (e.g., the refractive index of amorphous silicon in the visible light range is 4-4.5), which tends to refract off-axis light towards the surface normal of layer 34. As a result, coating 32 will tend to have an appearance that is relatively invariant to changes in viewing angle.

Layer 34 may have a thickness h of at least 15 nm, at least 20 nm, 20-80 nm, at least 40 nm, less than 70 nm, less than 80 nm, less than 100 nm, less than 120 nm, or other suitable thickness. The thickness h of layer 34 is preferably much less (e.g., at least 5 times less, at least 15 times less, at least 25 times less, or more) than the wavelength of visible light (e.g., about 500 nm) divided by 4*n, where n is the refractive index of amorphous silicon.

As shown in FIG. 3, optional passivation layer 38 may be formed on the innermost surface of layer 36 (e.g., in scenarios in which layer 30' is not present). Passivation layer 38 may be formed from any suitable material that helps protect layer 34. For example, passivation layer 38 may be formed from amorphous silicon and may help prevent aluminum or other metal in layer 36 from oxidizing when contacted by the atmosphere.

As illustrated by optional substrate layer 30', coating 32 may, if desired, be formed on an outer surface of device 10 (e.g., in an arrangement in which substrate layer 30 is not present and coating 32 covers the outer surface of a housing structure or other layer 30'). In this type of arrangement, a diamond-like carbon layer may be formed on the outer surface of coating 32 in the position shown by layer 30 of FIG. 3. The diamond-like carbon layer may help prevent damage to coating 32 from scratches.

Figure 4:
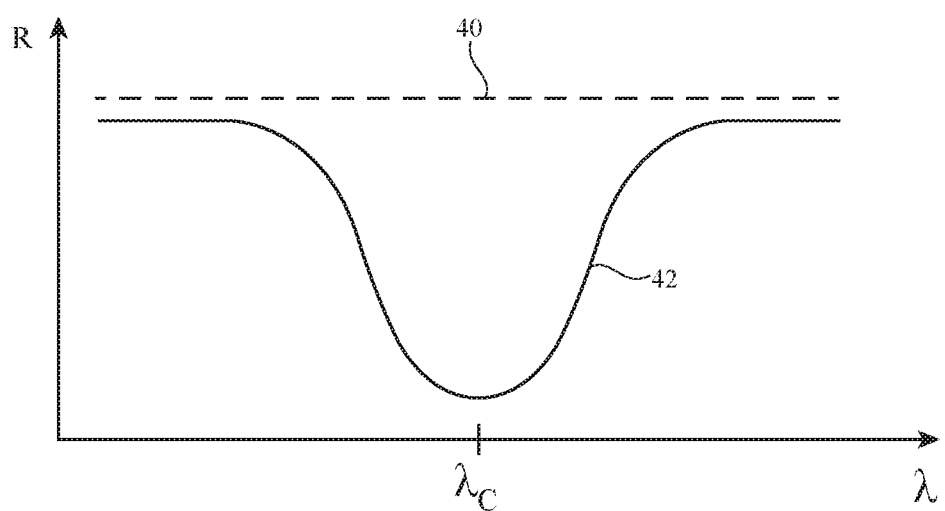
FIG. 4 is a graph in which light reflection has been plotted as a function of wavelength for structures associated with the coating of FIG. 3 in accordance with an embodiment.

FIG. 4 is a graph in which light reflectivity R has been plotted as a function of wavelength λ for layer 36 and coating 32. Layer 36 may be, for example, a metal layer such as an aluminum layer and may be characterized by a relatively broadband reflection spectrum (see, e.g., flat reflectivity curve 40 of FIG. 4). In the presence of silicon layer 34 on layer 36, coating 32 may exhibit thin-film interference effects (e.g., constructive interference at some wavelengths λ of visible light) so that the absorption of visible light by coating 32 may peak and the reflectivity of visible light may exhibit a valley at a wavelength such as wavelength λc. This is illustrated by curve 42 of FIG. 4, which represents the reflectivity spectrum of coating 32 at visible light wavelengths. The position of wavelength λc within the visible spectrum (390 to 700 nm) may be adjusted by selecting the value of thickness h of layer 34. The color of coating 32 can be tuned in this way (e.g., coatings 32 in which the thickness h of layer 34 is different will have different non-neutral colors).

Figure 5:
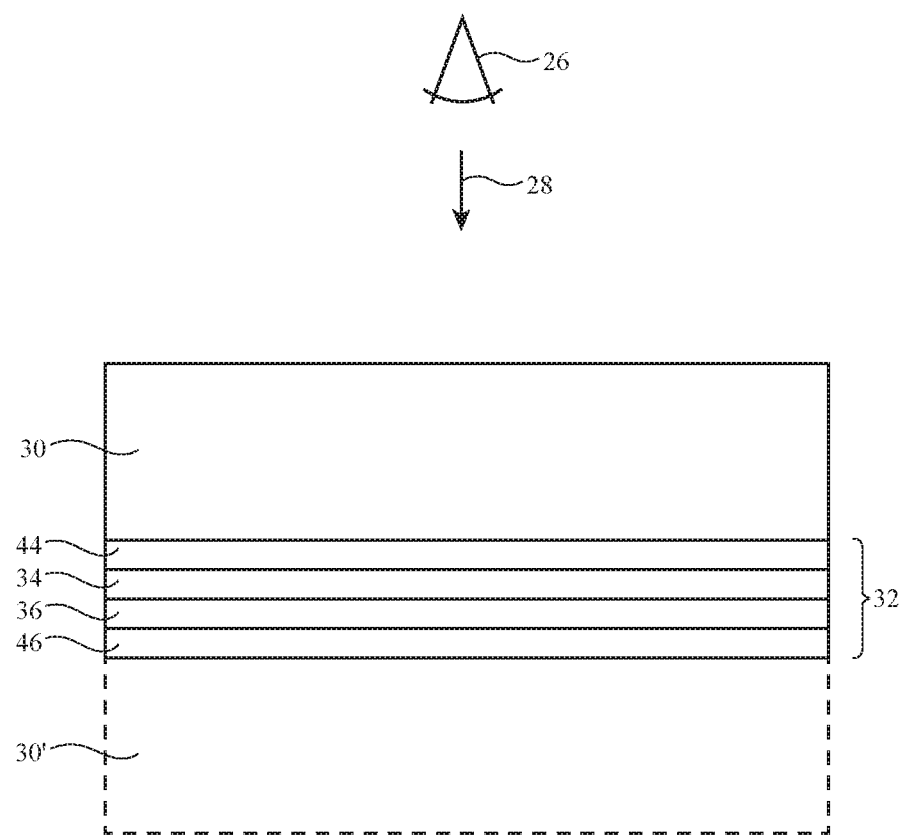
FIG. 5 is a side view of an illustrative housing structure with a coating in accordance with an embodiment.

Another illustrative configuration for coating 32 is shown in FIG. 5. In the example of FIG. 5, coating 32 has been formed on the inner surface of substrate layer 30. Layer 34 may be an amorphous silicon layer with a thickness h and layer 36 may be a metal layer such as an aluminum layer, as described in connection with FIG. 3. Adjustment of coating 32 (e.g., adjustment of thickness h) can be used to adjust the color of coating 32. Further adjustment of the color of coating 32 can be obtained by incorporating one or more colored dielectric layers into coating 32. For example, colored layer 44 may be interposed between layer 34 and substrate 30 and/or colored layer 46 may be formed on the innermost surface of layer 36.

Figure 6:
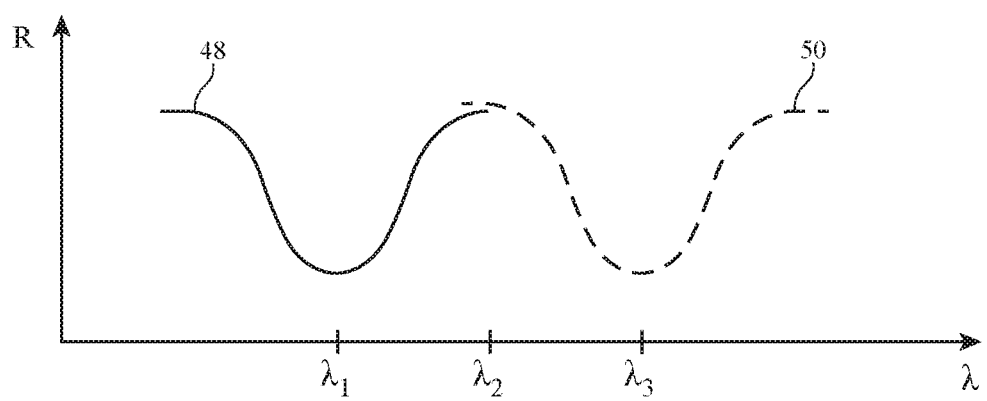
FIG. 6 is a graph in which light reflection has been plotted as a function of wavelength for structures associated with the coating of FIG. 5 in accordance with an embodiment.

Colored layers 44 and 46 may be formed from polymer or other dielectric that includes dye, pigment, or other colorant that provides layers 44 and 46 with desired color casts. The graph of FIG. 6 in which reflectivity R has been plotted as a function of wavelength λ illustrates a possible reflection spectrum for coating 32. Silicon layer 34 on metal layer 36 may be characterized by a reflection spectrum such as curve 48 (e.g., a reflection spectrum with a valley at wavelength λ1, corresponding to an absorption spectrum peak). Colored coating layer 44 (or colored coating layer 46, or both colored coating layers 44 and 46) may be characterized by a reflection spectrum such as curve 50 (e.g., a reflection spectrum with a valley at wavelength λ3, corresponding to an absorption spectrum peak due to the presence of dye, pigment, or other colorant). At wavelengths away from the reflectivity spectrum valleys at λ1 and λ3 (e.g., at wavelengths such as wavelength λ2, which may correspond to green light, for example), coating 32 will reflect light. As a result, coating 32 may have a color determined by the spectral responses of 1) layers 34 and 36) and 2) the colored coating material (e.g., layer 44 and/or layer 46). In arrangements in which the colored polymer material is formed on the inner surface of metal layer 36 (as shown by illustrative layer 46), ambient light passes through metal layer 36 before reaching layer 46. Layer 46 can adjust the color of coating 32, provided that layer 36 is sufficiently thin (e.g., 30-50 nm or less or other suitable thickness) to allow a non-negligible amount of light to pass to and from layer 46.

As illustrated by optional substrate layer 30', coating 32 of FIG. 5 may, if desired, be formed on an outer surface of device 10 (e.g., in an arrangement in which substrate layer 30 is not present). In this type of arrangement, a transparent diamond-like carbon layer may be formed on the outer surface of coating 32 in the position shown by layer 30 of FIG. 5 to help protect coating 32 from scratches.

Figure 7:
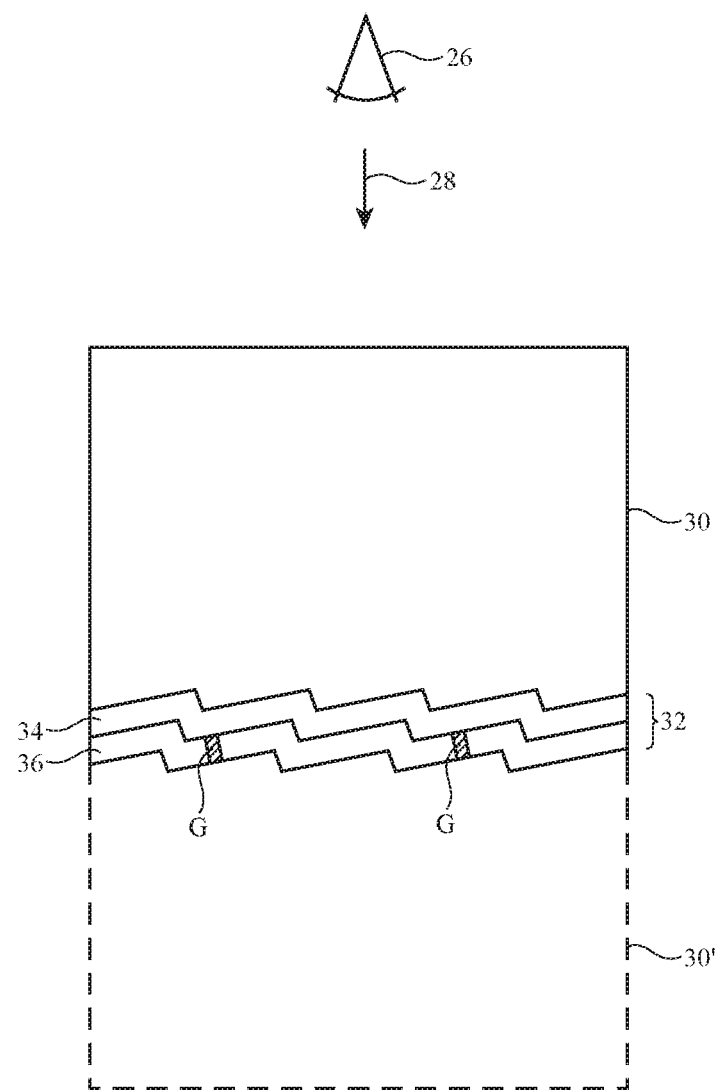
FIG. 7 is a diagram of an illustrative housing structure with a textured surface covered with a coating in accordance with an embodiment.

In some arrangements, it may be desirable for some or all of the coated structures in device 10 to exhibit a matte appearance. As shown in FIG. 7, coating layer 32 may be provided with a matte appearance by texturing the inner surface of substrate 30 (e.g., so that this surface has a root-mean-square surface roughness of at least 25 nm, at least 50 nm, at least 100 nm, less than 400 nm, less than 1600 nm, or other suitable surface roughness. This rough surface texture helps scatter ambient light that is reflecting off of coating 32 and thereby provides coating 32 with a matte appearance. As illustrated by optional substrate layer 30', coating 32 of FIG. 7 may, if desired, be formed on a textured outer surface of device 10 (e.g., a textured surface of layer 30') in an arrangement in which substrate layer 30 is not present. To help protect coating 32 in this type of arrangement, a protective coating such as a transparent diamond-like carbon layer may be formed on the outer surface of coating 32 (e.g., in the position of layer 30 of FIG. 7).

In some arrangements, it may be desirable for the colored coating to exhibit radio-frequency transparency. For example, in systems in which layer 30 forms an electronic device housing wall, it may be desirable to allow wireless power signals and/or radio-frequency antenna signals to be transmitted and/or received through layer 30 and the colored coating on layer 30. To enhance radio-frequency transparency for wireless communications and/or to support inductive wireless charging, conductive materials (e.g., metal layer 36) may be patterned to form isolated islands (e.g., rectangular pads or pads of other shapes such as triangles, hexagons, etc.) on layer 30. The pads may be tiled in an array with rows and columns or other suitable patterns. A mesh of gaps (e.g., intersecting lines extending horizontally and vertically between rows and columns of pads or other thin elongated gap structures such as illustrative gaps G in FIG. 7) may be present in the patterned layer. These gaps are free of metal or other conductive material in layer 36 and therefore block current flow (e.g., the gaps block eddy currents and prevent electromagnetic signal resonances from occurring). Each pad may have lateral dimensions equal to a fraction of a wavelength for radio-frequency signals of interest (e.g., less than 1/10 of a wavelength, less than 1/5 of a wavelength, at least 1/100 of a wavelength, at least 1/20 of a wavelength, etc.) or may have other suitable shapes and sizes for reducing or eliminating radio-frequency signal interactions as radio-frequency antenna signals and/or wireless power signals pass through layer 30.

In addition to or instead of patterning conductive layer(s) of material to form pads, layer conductivity can be reduced by using low-conductivity alloys. For example, layer 36 may be formed from a reflective alloy such as a metal-silicon alloy (e.g., aluminum silicon), or other metal which has a lower conductivity than pure aluminum. Lower conductivity metals that may be used in forming layer 36 include titanium and tin. The use of a lower conductivity material for forming layer 36 (in alloy form or pure form) may enhance radio-frequency transparency for layer 36 when compared to arrangements in which pure aluminum is used in forming layer 36.

Figure 8:
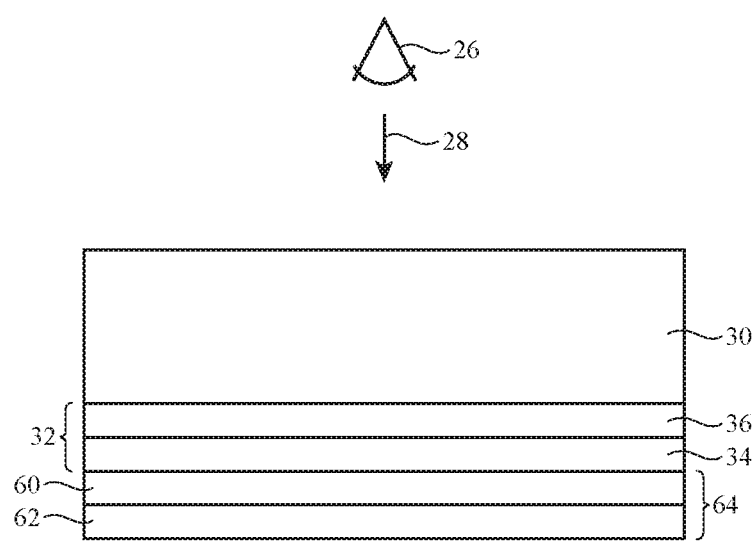
FIG. 8 is a side view of an illustrative housing structure with a radio-frequency transparent colored coating containing a metal alloy layer in accordance with an embodiment.

An illustrative configuration in which layer 30 has a coating that is radio-frequency transparent is shown in FIG. 8. In the example of FIG. 8, radio-frequency transparent coating layers have been formed on the inner surface of substrate layer 30. In particular, coating 32 has been formed on the inner surface of substrate layer 30. Layer 36 of coating 32 may be a highly resistive metal alloy layer containing titanium, aluminum, and nitrogen such as a TiAlN layer. Layer 34 may be an amorphous silicon layer. Layer 32 serves as a lossy antireflection coating. The color of layer 32 and therefore the appearance of the structures of FIG. 8 when viewed in direction 28 by viewer 26 may be tuned by adjusting the thickness of layers 34 and 36. The color of layer 32 may, if desired, be yellow, blue, red, or other non-neutral color. In general, the thicknesses of layers 34 and 36 may be 10-200 nm, at least 20 nm, at least 50 nm, less than 150 nm, less than 100 nm, or other suitable thickness. As an example, layer 36 may have a thickness of 75 nm and layer 34 may have a thickness of 24 nm. Color shifts due to variations in viewing angle may be negligible.

To ensure that coating 32 of FIG. 8 has sufficient radio-frequency transparency, the sheet resistance of the TiAlN layer may be adjusted (e.g., by adjusting the flow rate of $N_2$ gas that is present during the deposition process). Increases in $N_2$ flow rates have been observed to increase sheet resistance.

If desired, one or more coating layers may be formed on the inner surface of layer 32 to change the appearance of layer 32. In the example of FIG. 8, a thin-film interference filter that serves as a mirror (mirror coating) has been formed from thin-film stack 64. Thin-film stack 64 may contain a stack of two or more thin-film layers with different refractive index values (e.g., alternating higher and lower refractive index values). In the example of FIG. 8, stack 64 includes a first layer 60 and a second layer 62 with different respective refractive indices. Layer 60 may be, as an example, a silicon oxide layer with a thickness of 85 nm and layer 70 may be, as an example, an amorphous silicon layer with a thickness of 75 nm. Other materials and/or other thicknesses (e.g., thin-film thicknesses of at least 5 nm, at least 20 nm, at least 50 nm, less than 400 nm, less than 200 nm, or less than 100 nm) may be selected for the thin-film layers in stack 64. The thicknesses of the layers may be selected based on the materials used (and their refractive indices), the number of layers present, and the desired optical properties of the mirror coating (e.g., a desired target reflectivity).

The foregoing is merely illustrative and various modifications can be made to the described embodiments. The foregoing embodiments may be implemented individually or in any combination.

What is claimed is:

1. An electronic device, comprising:
   a housing structure formed of a transparent material, wherein the transparent material is transparent to visible light;
   a display coupled to the housing structure; and
   a colored coating on an inner surface of the housing structure, wherein the colored coating includes a metal layer and includes an amorphous semiconductor layer that is formed on the inner surface between the metal layer and the housing structure.

2. The electronic device defined in claim 1 wherein the amorphous semiconductor layer comprises an amorphous silicon layer.

3. The electronic device defined in claim 2 wherein the metal layer is formed on the amorphous silicon layer and wherein the metal layer comprises a metal layer selected from the group consisting of: a pure aluminum layer, an aluminum silicon alloy layer, a tin layer, a titanium layer, and a metal layer with gaps.

4. The electronic device defined in claim 3 wherein the amorphous silicon layer has a thickness of less than 120 nm.

5. The electronic device defined in claim 2 further comprising a passivation layer on the metal layer, wherein the metal layer is between the passivation layer and the amorphous silicon layer.

6. The electronic device defined in claim 1 wherein the transparent material comprises a transparent material selected from the group consisting of: glass and sapphire.

7. The electronic device defined in claim 1 wherein the housing structure comprises a rear housing wall and wherein the metal layer is patterned to form gaps that block eddy currents.

8. The electronic device defined in claim 1 wherein the housing structure comprises a housing wall with an outer surface opposing the inner surface and wherein the inner surface is textured and has a surface roughness of 25 nm to 400 nm.

9. An electronic device, comprising:
   a housing structure formed of a transparent material, wherein the transparent material is transparent to visible light;
   a display coupled to the housing structure; and
   a colored coating on an inner surface of the housing structure, wherein the colored coating includes a metal layer, an amorphous silicon layer between the metal layer and the housing structure, and a colored polymer layer.

10. The electronic device defined in claim 9 wherein the colored polymer layer comprises dye.

11. The electronic device defined in claim 9 wherein the colored polymer layer is formed on the inner surface between the amorphous silicon layer and the housing structure.

12. The electronic device defined in claim 9 wherein the colored polymer layer is formed on the metal layer and wherein the metal layer is between the colored polymer layer and the amorphous silicon layer.

13. The electronic device defined in claim 9 wherein the transparent material comprises a transparent material selected from the group consisting of: glass and sapphire.

14. An electronic device, comprising:
   a transparent housing wall, wherein the transparent housing wall is transparent to visible light;

a display coupled to the transparent housing wall; and a colored coating on the transparent housing wall that includes a metal alloy layer and an amorphous silicon layer.

15. The electronic device defined in claim 14 wherein the transparent housing wall has inner and outer surfaces, wherein the colored coating is on the inner surface, and wherein the metal alloy layer is between the amorphous silicon layer and the transparent housing wall.

16. The electronic device defined in claim 15 wherein the metal alloy layer comprises TiAlN.

17. The electronic device defined in claim 16 wherein the colored coating further comprises a mirror coating on the amorphous silicon layer.

18. The electronic device defined in claim 17 wherein the mirror coating includes a first layer and a second layer, wherein the first layer is between the second layer and the amorphous silicon layer, and wherein the first layer comprises silicon oxide.

19. The electronic device defined in claim 18 wherein the second layer comprises amorphous silicon.

20. The electronic device defined in claim 14 wherein the transparent housing wall comprises a rear housing wall and wherein the colored coating comprises a mirror coating on the amorphous silicon layer that is formed from a stack of thin-film layers.

\* \* \* \* \*